United States Patent
Brown

[19]

[11] Patent Number: 6,139,362
[45] Date of Patent: Oct. 31, 2000

[54] FASTENER FOR CONNECTING AN ELECTRICAL DEVICE TO A SUBSTRATE

[75] Inventor: John Bossert Brown, Dillsburg, Pa.

[73] Assignee: Berg Technology, Inc., Reno, Nev.

[21] Appl. No.: 09/364,451

[22] Filed: Jul. 30, 1999

[51] Int. Cl.[7] .......................... H01R 12/00; H01R 13/73; H01R 13/64; H01R 13/848; H05K 1/00

[52] U.S. Cl. .............. 439/567; 439/79; 439/572; 439/381; 439/607; 439/80; 439/81

[58] Field of Search .................. 439/79, 80, 81, 439/82, 83, 381, 572, 567, 607

[56] References Cited

U.S. PATENT DOCUMENTS

| | | | |
|---|---|---|---|
| 5,083,942 | 1/1992 | Hahn | 439/567 |
| 5,145,407 | 9/1992 | Obata et al. | 439/567 |
| 5,154,634 | 10/1992 | Brown et al. | 439/553 |
| 5,228,870 | 7/1993 | Gorenc et al. | 439/567 |
| 5,244,412 | 9/1993 | Hatch et al. | 439/567 |
| 5,257,947 | 11/1993 | Scheer et al. | 439/567 |
| 5,316,500 | 5/1994 | Vanaleck et al. | 439/567 |
| 5,340,321 | 8/1994 | Hashiguchi et al. | 439/108 |
| 5,393,247 | 2/1995 | DiOrazio et al. | 439/567 |
| 5,401,187 | 3/1995 | Ortega | 439/567 |
| 5,415,565 | 5/1995 | Mosquera | 439/567 |
| 5,422,789 | 6/1995 | Fisher et al. | 361/719 |
| 5,460,543 | 10/1995 | Kosmala | 439/567 |
| 5,478,257 | 12/1995 | Cachina et al. | 439/567 |
| 5,591,048 | 1/1997 | Hahn | 439/567 |
| 5,630,730 | 5/1997 | Wang et al. | 439/567 |
| 5,632,649 | 5/1997 | Spangler | 439/567 |
| 5,664,965 | 9/1997 | Clark et al. | 439/567 |
| 5,971,803 | 10/1999 | McHugh et al. | 439/567 |

Primary Examiner—Paula Bradley
Assistant Examiner—Edwin A. León
Attorney, Agent, or Firm—Woodcock Washburn Kurtz Mackiewicz & Norris LLP

[57] ABSTRACT

A fastener apparatus for mechanically connecting and holding the main housing of an electrical device, such as an electrical connector, to a substrate, such as a PCB, in a manner that allows for a relatively low insertion force and a corresponding relatively high retention force. The fasteners are adapted for attachment to both an electrical connector and to a substrate, thereby forming a mechanical connection between the two. Preferably, one or more fasteners are attached to the housing of the electrical connector and then the electrical connector having fasteners extending therefrom is connected to board openings formed in the PCB. The fastener apparatus is constructed having one or more arms connected to a bottom end of the fastener, the arms sweep outward and upward from the bottom end toward the top end. Preferably, the arms have a cantilevered design that allows the arms to deflect inward during insertion of the fastener into the board openings, thereby providing for a relatively low insertion force. Preferably, the arms are also formed having a taper. The tapered design of the arms has a predetermined inclined surface, forming an angle of inclination which results in a more onsistent insertion force, and does not create any sudden release of force or energy during insertion of the fastener into the substrate which might dislodge components mounted on the surface of the substrate. The arms are formed having an apex formed at the distal end. The apexes are adapted for connectively engaging the side walls of the board openings of the substrate thereby providing a retention force to hold the connector on the substrate. In addition, the arms tend to splay outward when a withdrawal force is applied to the fastener causing the arms to bite into the side walls of the board opening. This results relatively high retention force that holds the connector on the substrate.

19 Claims, 4 Drawing Sheets

FASTENER FOR CONNECTING AN ELECTRICAL DEVICE TO A SUBSTRATE

FIELD OF THE INVENTION

This invention relates generally to the field of electrical devices intended to be mounted on a substrate, such as a printed circuit board (PCB), and particularly to an apparatus for establishing a mechanical connection between the electrical device and the PCB. More particularly, the present invention relates to an apparatus and method of mechanically connecting an electrical connector to a PCB.

BACKGROUND

It is known to couple electrical signals to conductive traces formed on PCBs by means of permanently mounted electrical connectors mechanically and electrically attached to the PCB. The PCBs on which such electrical devices are mounted are provided with terminal pads or bores which form part of the PCBs. The electrical devices are provided with contacts or leads which are configured and positioned to be placed in overlying alignment with the terminal pads or bores. Generally, the pads are coated with a solder paste composition and, after the contact portions of the contacts or leads are placed into engagement with appropriate terminal pads, the solder paste composition is reflowed to thereby obtain a secure electrical engagement between each contact portion and its respective terminal pad.

Electrical connector devices are also mechanically connected to the substrates, generally by fasteners, such as mounting posts, hold downs, board locks, etc., that are inserted into corresponding openings formed in the PCB. These fasteners are typically used to align and secure the electrical connector in a predetermined position. The fasteners also hold the connectors in place for soldering, such that the solder tails remain inside the bores (or in position against the pads) of the PCB during solder reflow or other operations. In addition, the fasteners reduce stresses on the solder joints of the mounted components.

The fasteners are typically coupled to a connector using various techniques. Known fasteners for holding connector bodies against the surface of a PCB include top-actuated eyelets, heat stakes, screws, rivets, non-metallic posts, plastic snap fit pegs, pinch eyelets, nuts and bolts, and barbed press-fit hold downs for securing the connector to the PCB. Such fasteners typically extend through or engage a hole formed in the PCB.

These convention fasteners, however, typically exhibit a high insertion force in order to insert the fastener into the opening in the PCB making mounting of the electrical connector onto the surface of the PCB difficult. In addition, many of the conventional fasteners exhibit a low retention force between the fastener and the side walls of the opening in the PCB which results in the electrical connector becoming loosened or dislodged from the surface of the PCB.

Another drawback to certain styles of conventional fasteners is that, in order to develop sufficient retention force, some fasteners are designed to pass through a hole in the PCB and protrude through the opposite surface. For example, one style of non-metallic post is passed through a hole in the surface of the board and "staked," or deformed, to form a plug on the opposite surface. Still further, fasteners with hooked ends will snap into engagement with the underside of the board, causing many small components that are placed on the solder paste prior to reflow to be jarred from their pads. In addition, the fasteners must be specially sized for each application, having an appropriate diameter corresponding to the diameter of the opening in the printed circuit board, and a length corresponding to the board thickness. This adds costs and complexity to the fastener and the assembly process.

Another proposed style of fastener is anon-metallic post which is press fit into a hole in the board. Unlike those previously discussed, press fit fasteners need not protrude through the opposite surface of the board. Unfortunately, many press fit fasteners require insertion forces which may preclude their insertion by hand tools. Furthermore, such fasteners are very sensitive to tolerance stack-ups between the hole diameter and the fastener diameter.

Other known fasteners have a body design that requires some type of forming operation during the manufacturing process. This forming operation adds complexity and costs to the manufacturing of the fastener.

Accordingly, there remains a need for a fastener having the characteristics of a low insertion force and at the same time a sufficient retention force to hold down various connectors to a substrate. There remains a further need for such a fastener which also provides an efficient way to align the contact terminals on the connector with which it is used with their respective mounting apertures on the substrate

SUMMARY

The present invention is directed to a low insertion force/high retention force fastener for connecting an electrical device to a substrate. This invention solves the need of providing a means of connecting an electrical device, such as an electrical connector, to a substrate, such as a PCB. The invention provides an electrical connector having one or more fasteners extending outward from the connector housing that protect the connector solder tails from stubbing during installation thereby making the entire connector design more robust. In addition, the device has a smooth insertion curve thereby minimizing any dislodgement of delicate surface mounted components.

According to one aspect of the present invention, an apparatus and method are disclosed for mechanically supporting and holding the main housing of a connector to a daughterboard PCB in such a manner that allows for a low insertion force to retention force ratio. Each fastener has one or more cantilevered arms or beams fixed at the bottom of the fastener body that sweep upwards toward the top of the fastener. The arms have an inclined or ramped design which provides a more gradual lead in to help reduce insertion forces. The cantilevered arms are also tapered to allow more deflection of the arms before plastic deformation occurs, thereby helping to further reduce insertion forces.

An apex is formed at the end of each of the arms. The apexes are adapted for engaging the side walls of openings formed in the PCB thereby providing a retention force. In addition, the arms tend to splay outwardly when a withdrawal force is applied to the fastener causing the arms to bite into the side walls of the opening in the substrate. This results in a relatively high retention force that holds the electrical connector on the substrate.

The fastener can be produced in a stamping die without the need for any forming operations. Accordingly, this design provides easy of manufacture at a low cost.

BRIEF DESCRIPTION OF THE DRAWINGS

These and other features, aspects, and advantages of the present embodiment of the invention will become better understood with regards to the following description, appended claims, and accompanying drawings where:

DETAILED DESCRIPTION OF THE PREFERRED EMBODIMENTS

Figure 1:
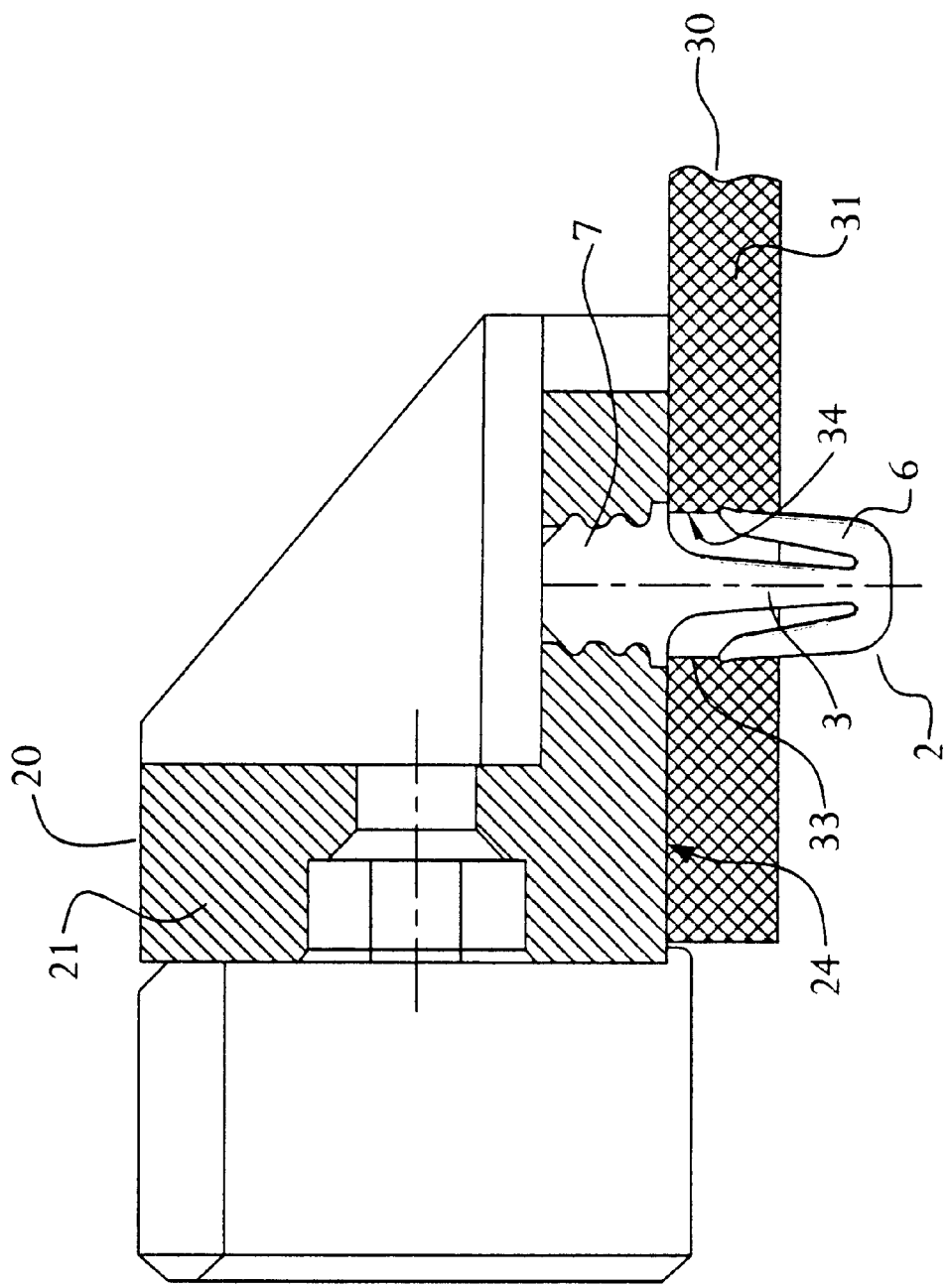
FIG. 1 is a side view of an exemplary embodiment of a fastener apparatus of the present invention connecting an electrical connector to a substrate.

Throughout the following detailed description similar reference numbers refer to similar elements in all the figures of the drawings. With reference to FIGS. 1 through 5, shown is an exemplary embodiment of the fastener apparatus of the present invention. The fastener apparatus is mechanically attached to an electrical connector and then the connector having one or more fasteners extending outward therefrom is mechanically attached to a substrate, such as a PCB. The fastener apparatus is generally indicated by the reference character 2.

FIGS. 1 through 5 show a fastener apparatus 2 in accordance with an exemplary embodiment of the present invention. As shown, fastener 2 includes a body 3 having a top end 4 and a generally flattened bottom end 5. A retaining structure 6 is disposed proximate the bottom end 5 and sweeps upward toward the top end 4. An attachment structure 7 is disposed proximate the top end 4 of the body 3. The fastener 2 is adapted to be mechanically connected to an electrical connector 20 and to a substrate 30 hereby forming a mechanical connection between the two. Preferably, two or more fasteners 2 are used to connect the electrical connector 20 to the substrate 30. However, one fastener 2 may be sufficient to provide the necessary retention force required to hold the connector 20 on the PCB 30.

Figure 2:
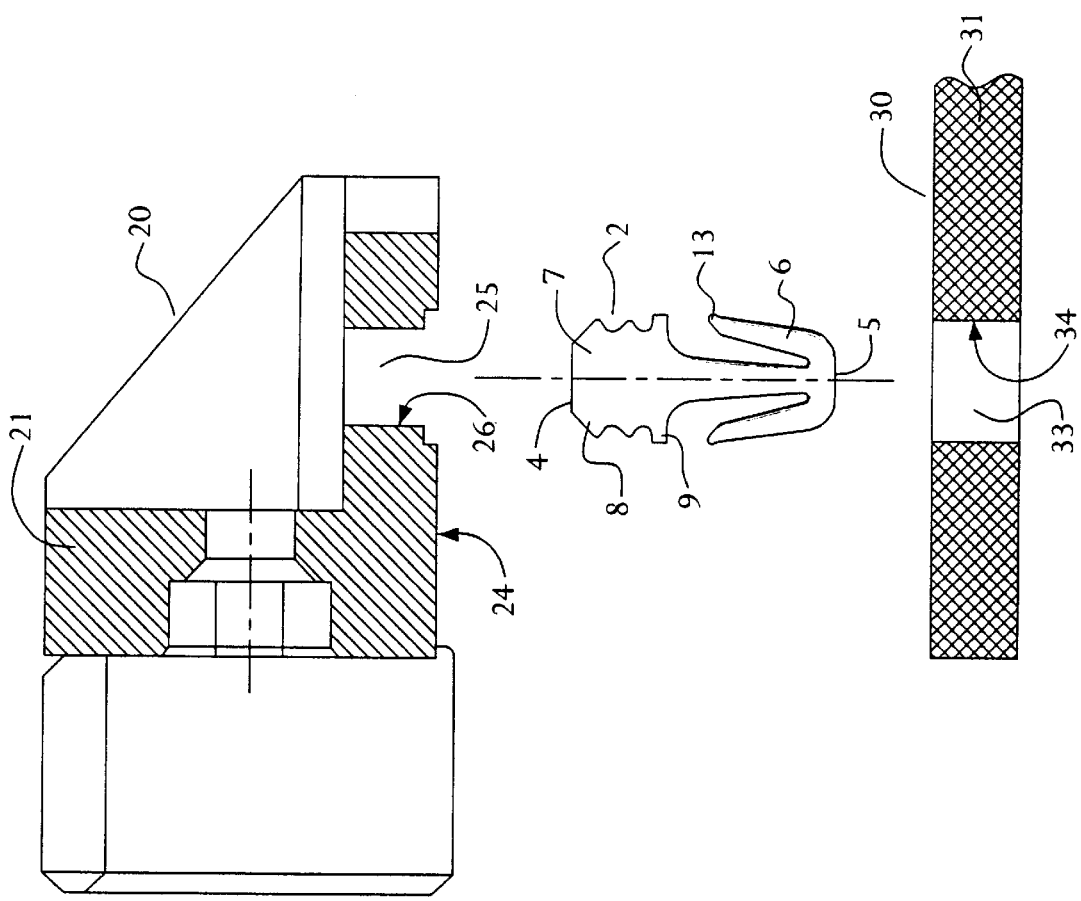
FIG. 2 is an exploded view of the fastener apparatus of FIG. 1.

Referring to FIGS. 1 and 2, substrate 30 includes aboard body 31 having a plurality of electrically conductive traces (not shown) or contact pads disposed thereon for establishing an electrical connection between connector 20 and substrate 30. The PCB 30 is formed having one or more board openings 33 formed in the body 31 for mechanically securing connector 20 to PCB 30. The board opening 33 is formed to receive fastener 2 of the present invention and is adapted to form a friction fit between the fastener 2 and side walls 34.

Connector 20 includes a housing 21 having an arrangement of electrically conductive contact terminals (not shown). Each of the individual terminals has a tail portion (not shown) that extends through a mounting surface 24 of the housing 21. The tail portions extend from the housing 21 and function to make contact with the traces (or contact pads) on the PCB 30 thereby establishing an electrical connection between the traces of the PCB 30 and the terminals of connector 20. The housing 21 is preferably formed out of an electrically insulative material, such as a plastic material.

The connector 20 also includes one or more cavities 25 formed in the housing 21 for receiving and connectively engaging the top portion 4 of the fastener 2. As shown, cavities 25 are formed as an opening in the mounting surface 24 that extends into the housing 21. Preferably, the cavities 25 are formed at opposite ends of the housing 21. Alternatively, the cavities 25 may be formed in separate mounting foots or mounting flanges (not shown).

Each cavity 25 is adapted to receive and connectively engage the attachment structure 7 of a fastener apparatus 2. Each cavity 25 includes side wall 26 which is adapted for forming an interference fit with the attachment structure 7 of the fastener 2. The upper portion serves to hold the fastener 2 in the housing cavity 25 and prevent the fastener 2 from being pulled out of the cavity 25. The lower portion serves to hold the fastener 2 in the housing cavity 25 and prevent the fastener 2 from being pushed too far up into the housing 21.

The fastener 2 of the present invention may be used with an existing cavity 25 already formed in the connector housing 21. For example, in one preferred embodiment, the fastener 2 may be installed in the existing through hole formed in the connector housing 21. In this way, no additional or special features are required to form the mechanical connection between the fastener 2 and the connector housing 21.

Figure 3:
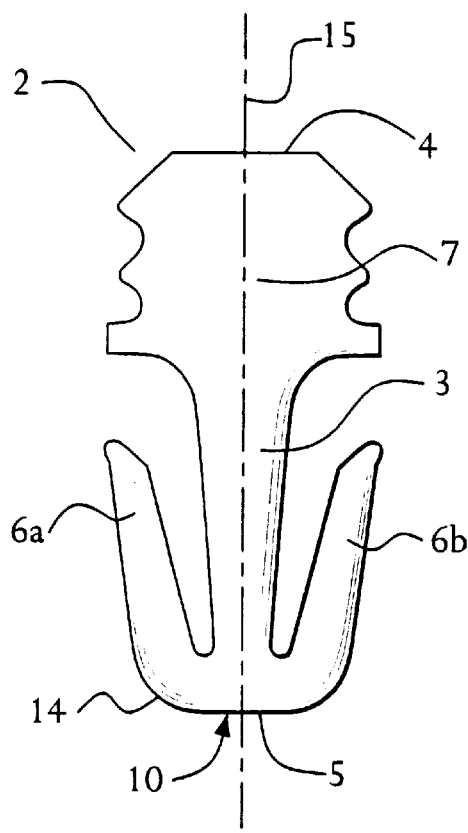
FIG. 3 is a front view of the fastener of FIG. 1.

The body 3 is preferably formed having a substantially flat planar shape, as shown in FIG. 3. Also, as shown in FIG. 3, the body 3 preferably has a tapered design which facilitates the inward elastic deflection of the cantilevered arms of retaining structure 6 (e.g., the width of the body 3 narrows from the top end 4 to the bottom end 5). Alternatively, the body 3 is formed having an inclined surface 19a on each side tapering outwardly from the bottom 5 toward the top 4. Preferably, the first inclined surface 19a is formed having an angle of inclination $\theta_1$ from the longitudinal axis 15 of the body 3 of about 4 degrees.

The length, width, and thickness of the fastener 2 are predetermined based on the particular application and customer requirements. Preferably, the length is predetermined based on the desired lead in of the fastener 2. Depending on the thickness of the substrate 30 to which the connector 20 is being mounted to, the fastener 2 may or may not protrude through the board openings 33. Preferably, the width of the body 3 is predetermined to correspond to the width of the board opening 33 and to the desired width of the retaining structure 6. The width of the body 3 is sized such that the body 3 does not impede the inward deflection of the arms 6a and 6b as the fastener 2 is inserted into a board hole 33. Preferably, the thickness of the body 3 is sufficient to provide structural rigidity to the fastener 2 and to withstand the anticipated insertion and retention forces based on the particular application.

In a currently preferred embodiment, the fastener 2 has an overall length from the top end 4 to the bottom end 5 of about 0.287 inch, a length from the attachment structure 7 to the arms 6a and 6b of about 0.150 inch, a tapered width from about 0.0463 inch proximate the top 4 to about 0.0350 inch proximate the bottom 5, and a thickness of about 0.020 inch.

Preferably, the body 3 is formed as a one-piece substantially planar body 3 by stamping the fastener 2 out of a flat metallic sheet, without the need for any forming operations. By producing the fastener 2 in a stamping die without any forming operations, the design may be manufactured at a relatively low cost, especially in comparison to designs requiring any type of forming operation.

The top end 4 of the body 3 includes an attachment structure 7 adapted to form a mechanical connection between the fastener 2 and the connector housing 21. The attachment structure 7 may comprise any conventional attachment technique for attaching a fastener 2 to connector housings 21. As shown in FIG. 2, the attachment structure 7 includes one or more upper shoulders 8 and one or more lower shoulders 9 that are constructed to form an interference fit with the side wall 26 of cavity 25.

It should be understood that the attachment structure 7 and the connection between the fastener 2 and the connector housing 3 may comprise any other suitable connection technique and structure to connect the fastener 2 to the connector 20, such as pegs, dowel pins, screws, bolts, clips, interference fit, keys, slots, etc.

Referring to FIG. 3, the bottom end 5 is preferably formed having a flat edge 10. The flat edge 10 facilitates locating the connector 20 on the PCB 30. By having a flat edge 10, connector 2 may slide across the surface of the PCB 30 until the bottom end 5 lines up with the board holes 33. Alternatively, the bottom edge 10 maybe formed having an edge that is not flat. In addition, the outer corners 14 of each arm 6 are preferably rounded to further facilitate locating the connector 20 on the PCB 30.

Figure 5:
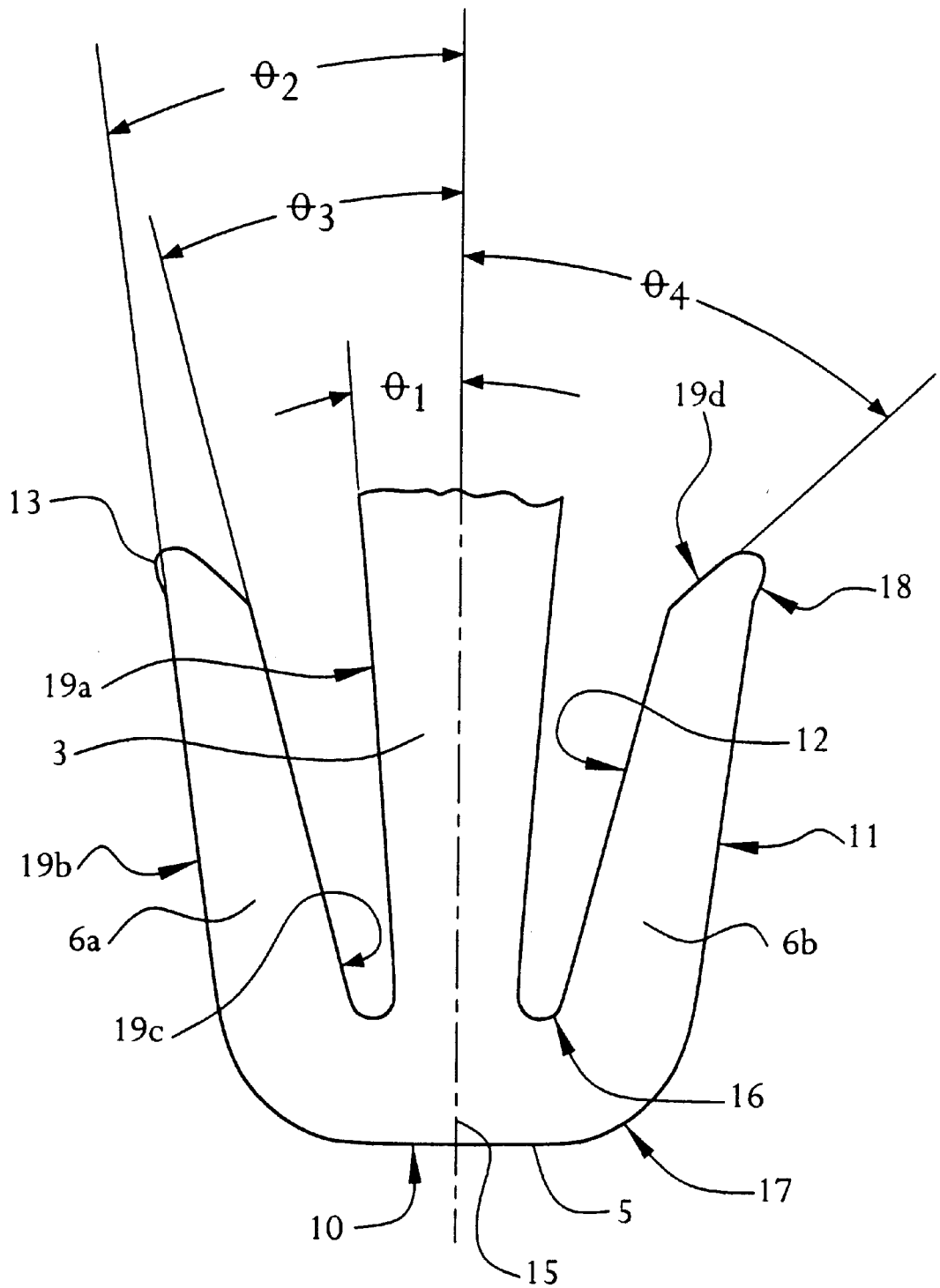
FIG. 5 is a detail view of the retaining structure of the fastener of FIG. 3.

FIG. 5 shows a detail of the currently preferred embodiment of fastener 2. Preferably, fastener 2 is formed having two arms 6a and 6b disposed on opposite sides of body 3. Each arm 6 is preferably formed in the same plane (e.g., is coplanar) as the body 3 and is attached to the bottom 5 of the fastener 2 and sweeps up toward the connector housing 21. The length of each arm 6 is less than the length of the body 3 and does not extend up to the attachment structure 7. Preferably, the inside radius of curvature 16 of the connection of each beam 6 to the body 3 is about 0.005 inch and the outside radius of curvature 17 of the connection of each beam 6 to the body 3 is about 0.034 inch.

The arms 6 are preferably formed having a cantilevered design. This cantilevered design allows deflection inward toward the body 3 as the fastener 2 is inserted into a board opening 33. Accordingly, arms 6a and 6b act as spring members allowing more deflection at the distal or free end of the arms 6. This provides for a fastener 2 having a relatively low insertion force. Arms 6 may be formed separate from and then attached to the body 3, or preferably, the arms 6 are formed integral with the body 3.

In addition, each arm or beam 6 is formed having a tapered design or outer and inner inclined surfaces. Arms 6 taper from the point of attachment at the bottom end 5 toward the distal end of the arm 6. The tapered design of the arms 6 allows for more deflection before plastic deformation occurs. As the fastener 2 is inserted into the board opening 33, the outer edges 11 slide against the side wall 34 of the board opening 33 and cause the arms 6 to deflect inward toward the body 3. The distal or free end having a smaller width is allowed to flex more than the bottom of the beam 6 which is wider and also attached to the bottom end 5. Also, the tapered design provides for a gradual lead in ramp which results in a smooth insertion force curve without any sudden releases of energy for the fastener 2.

In a currently preferred embodiment, the outer edge 11 of each beam 6 is formed having a second inclined surface 19b from the bottom 5 toward the top 4. Preferably, the second inclined surface 19b is formed having an angle of inclination $\theta_2$ from the longitudinal axis 15 of about 7 degrees. The inner edge 12 of each beam 6 is formed having a third inclined surface 19c from the bottom 5 toward the top 4. Preferably, the third inclined surface 19c is formed having an angle of inclination $\theta_3$ from the longitudinal axis 15 of about 14 degrees. The ramped design of the arms 6 provides a more gradual lead in which helps to reduce insertion forces. The taper also allows more deflection of the arms 6 before plastic deformation occurs thereby further helping to reduce insertion forces. This tapered design of each beam 6 provides for a smooth insertion force because the gradual angle of inclination results in a consistent insertion force without any sudden release of energy where the beams 6 do not pass through the PCB 30.

An apex 13 is formed at the distal end of each beam 6. Each apex 13 is adapted to form a friction fit between the apex 13 and the side walls 34 of each board opening 33. The distal end of each beam 6 also includes a fourth inclined surface 19d from the bottom 5 toward the top 4 along the inner edge 12. Preferably, the fourth inclined surface 19d forms an angle of inclination $\theta_4$ of about 48 degrees from the longitudinal axis 15. Preferably, each apex 13 is constructed having a radius of curvature 18 at the apex of about 0.005 inch. Preferably, each of the above angles of inclination has a tolerance of about ±2 degrees.

When the fastener 2 is fully inserted into the board opening 33, the apexes 13 will be positioned within the board openings 33 and the apexes will be in mechanical engagement with the side walls 34. The arms 6 act as spring mechanism and tend to splay outwardly when a withdrawal force is applied to the fastener 2 causing the arms 6 to bite into the side walls 34. This results in a relatively high retention force that holds the electrical connector 20 on the substrate 30.

When fastener 2 is inserted into a board opening 33, it is preferred that the apexes 13 do not protrude through to the opposite side of the substrate 30. This prevents the problem of the arms 6 of the fastener 2 springing back to their normal un-deflected position as they would if the apexes 13 were allowed to pass through the board opening 33.

For a free standing connector 20 having one or more fastener 2 disposed in the housing 3 and extending from a mounting surface 24, the width of the fastener 3 at the bottom end 5 is less than the diameter of the board opening 33. The width defined by the distance between the apexes 13 is greater than the diameter of the board opening 33.

The connector 20 having fasteners 2 attached thereto and extending therefrom may be pressed into board opening 33 on the PCB 30 by hand or using a vice or seating tool. The fasteners 2 may form either a removable or non-removable attachment of the connector 20 to the PCB 30. Preferably, the attachment is non-removable, meaning that the fasteners 2 cannot be removed from the PCB 30 without breaking, damaging, or deforming the fastener 2, the connector housing 21, or the PCB 30.

Preferably, the fastener apparatus 2 is made out of a metallic material. The use of a metal fastener 2 is desired because of the fact that the metal material is harder and possesses greater strength compared to most polymers. Alternatively, the fastener 2 may comprise a non-metallic material, such as a plastic or polymer material.

Figure 4:
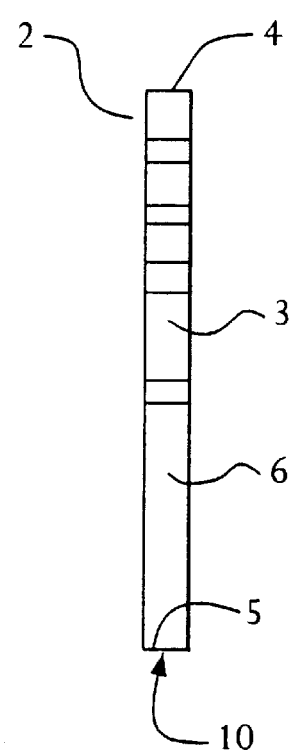
FIG. 4 is a side view of the fastener of FIG. 3.

Referring particularly to FIGS. 2 through 4, it will also be appreciated that the fastener 2 of the present invention has the additional advantage of allowing the contact terminals (not shown) on the connector 20 to be efficiently aligned, without the undue risk of bending, with their respective mounting apertures (not shown) on the board body 31. This alignment procedure may be carried out by means of the following steps. Initially, the fasteners 2 and attached connector 20 will be positioned to achieve gross alignment with the board openings 33. Then the flattened bottom end 5 and adjacent rounded corners 14 of the fastener 2 are inserted into the board openings 33 without the application of axial force and without the deformation of the fastener 2 so that the contact terminals are aligned with and initially engaged with their respective mounting apertures in the board body 31. A downward force is then applied to the connector 20 and its attached fasteners 2 to seat the contact terminals in their respective mounting apertures and to then seat the fasteners 2 in their respective board opening 33 in the way described above. It will be further appreciated that the flattened bottom 5 and adjacent rounded corners 14 of the fastener facilitate the alignment and engagement of the contact terminals with their respective mounting apertures in the board 31 in the way described above.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for connecting an electrical device to a substrate, said fastener comprising:

a fastener body having a top end and a bottom end;

an attachment structure disposed proximate said top end of said fastener for connecting said fastener to said electrical device; and a retaining structure attached to said bottom end and a taper comprising two inclined surfaces, wherein two inclined surfaces, wherein one inclined surface is formed along an outer edge of one or more arms from said bottom toward said top, and wherein one inclined surface is formed along an inner edge of each of said arms from said bottom toward said top of said fastener for connecting said fastener to said substrate, said retaining structure sweeping upward from said bottom end toward said top end.

2. The fastener of claim 1 wherein said inclined surface along said outer edge forms an angle of inclination from a longitudinal axis of said body of about 7 degrees, and wherein said inclined surface along said inner edge forms an angle of inclination from said longitudinal axis of about 14 degrees.

3. The fastener of claim 1 wherein said attachment structure is attached to said housing using an existing cavity formed in said electrical device.

4. The fastener of claim 1 wherein said bottom end of said fastener is flattened and there are rounded corners between said flattened bottom end and said retaining structure to facilitate overall alignment and positioning of said electrical device on said substrate.

5. The fastener of claim I wherein said retaining structure further comprises:

said arms attached to said bottom end of said body, said one or more arms extending outward and upward from said bottom of said body; and an apex formed at a distal end of each said one or more arms.

6. The fastener of claim 5 wherein said one or more arms comprises two arms disposed on opposite sides of sad body.

7. The fastener of claim 5 wherein said one or more arms include a cantilevered design that allows said one or more arms to deflect inward toward said body.

8. The fastener of claim 5 wherein said one or more arms are constructed having a taper, said one or more arms tapering down from said bottom of said arm to said apex of said arm.

9. The fastener of claim 5 wherein said apexes are adapted for engaging a side wall of a board opening formed in said substrate.

10. The fastener of claim 5 wherein said apexes are formed having a radius of curvature of about 0.005 inch.

11. A fastener for connecting an electrical device to a substrate, said fastener comprising:

a fastener body having a top end and a bottom end;

an attachment structure disposed proximate said top end;

one or more retaining cantilevered arms attached to said bottom of said body, said one or more arms sweeping outward and upward from said bottom end toward said top end;

wherein said one or more arms having a tapered construction that results in a consistent insertion force, and does not create any sudden release of energy as said one or more arms are inserted into a board opening formed in said substrate;

an apex formed at a distal end of each of said one or more arms, said apexes adapted for engaging a side wall of said board openings formed in said substrate and the bottom end of said fastener body is flattened and there is a rounded corner between said flattened bottom end and said one or more arms sweeping outward and upward from said bottom end to facilitate aligning and connecting said electrical connector to said substrate.

12. A fastener system for locating and connecting an electrical connector to a substrate, said fastener system comprising:

an electrical connector having a housing, one or more cavities formed in said housing, and a plurality of electrical contact terminals disposed in said housing for establishing an electrical connection to said substrate;

a substrate having one or more board openings and a plurality of electrical terminal pads or bores formed therein, said plurality of electrical terminal pads or bores being adapted for establishing an electrical connection to said electrical contact terminals;

one or more fasteners comprising:

a body having a top end and a bottom end;

an attachment structure disposed proximate said top end, said attachment structure being adapted for forming a mechanical connection to said one or more cavities;

a retaining structure attached to said bottom end, said retaining structure sweeping outward and upward from said bottom end toward said top end, said retaining structure being adapted for forming a mechanical connection to said one or more board openings and one or more arms are formed extending upwardly from said bottom end of said body having an outer edge forming an inclined surface, said inclined surface of said outer edge acting to deflect said one or more arms inward toward said body as said arms slide in said board opening in said substrate.

13. The fastener system of claim 12 wherein said body has a flattened bottom end and there is at least one rounded corner between said flattened bottom end and said retaining structure to facilitate the locating and connecting of said electrical connector to said substrate.

14. The fastener system of claim 12 wherein said retaining structure further comprises:

said one or more arms attached to said bottom end of said body, said one or more arms extending outward and upward from said bottom of said body; and an apex formed at a distal end of each said one or more arms.

15. The fastener system of claim 10 wherein said one or more arms include a cantilevered design that allows said one or more arms to deflect inward toward said body.

16. The fastener system of claim 14 wherein said one or more arms are constructed having a taper, said one or more arms tapering from said bottom of said arm to said apex of said arm.

17. The fastener system of claim 14 wherein said apexes are adapted for engaging a side wall of a board opening formed in said substrate.

18. A method for mechanically locating and connecting an electrical connector to a substrate, said method comprising the steps of:

provuding a connector housing having one or more cavities formed therein;

forming one or more fasteners comprising a body, an attachment structure formed at a top of said body, and a retaining structure formed at a bottom end of said body that sweep outward and upward toward said top end;

attaching said attachment structure to said cavities to form a connector and fastener combination;

providing a substrate having one or more board openings formed therein; and inserting said retaining structure of said fastener into said board opening thereby connecting said connector and fastener combination to said substrate and wherein said attachment structure comprises one or more upper shoulders and one or more lower shoulders, said upper shoulders and said lower shoulders being adapted for forming an interference fit with a housing of said electrical connector.

19. The method of claim 18, wherein the step of inserting said retaining structure further comprises the step of sliding an outer edge of one or more cantilevered arms of said retaining structure along a side wall of said board opening, thereby deflecting said cantilevered arms inward toward said body, until an apex formed at a distal end of each of said one or more cantilevered arms enter said board opening and connectively engages said side wall of each of said board openings to connect and hold said connector to said substrate.

* * * * *

UNITED STATES PATENT AND TRADEMARK OFFICE
CERTIFICATE OF CORRECTION

PATENT NO. : 6,139,362
DATED : October 31, 2000
INVENTOR(S) : John Bossert Brown It is certified that error appears in the above-identified patent and that said Letters Patent is hereby corrected as shown below:

Column 7,
Lines 49 through 55, claim 5 should read as follows:

5. The fastener of claim 1 wherein said retaining structure further comprises:
said arms attached to said bottom end of said body, said one or more arms extending outward and upward from said bottom of said body; and
an apex formed at a distal end of each said one or more arms.

Lines 56 through 57, claim 6, should read as follows:
6. The fastener of claim 5 wherein said one or more arms comprises two arms disposed on opposite sides of said body.

Signed and Sealed this

Twenty-third Day of October, 2001

*Attest:*

*Nicholas P. Godici*

NICHOLAS P. GODICI
*Attesting Officer*     *Acting Director of the United States Patent and Trademark Office*